United States Patent
Ho et al.

(10) Patent No.: US 11,158,570 B2
(45) Date of Patent: Oct. 26, 2021

(54) SEMICONDUCTOR DEVICES HAVING ELECTROSTATIC DISCHARGE LAYOUTS FOR REDUCED CAPACITANCE

(71) Applicant: Micron Technology, Inc., Boise, ID (US)

(72) Inventors: Michael V. Ho, Allen, TX (US); Eric J. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/976,674

(22) Filed: May 10, 2018

(65) Prior Publication Data

US 2019/0348363 A1    Nov. 14, 2019

(51) Int. Cl.
| H01L 23/522 | (2006.01) |
| H01L 21/768 | (2006.01) |
| H01L 27/02  | (2006.01) |

(52) U.S. Cl.
CPC .... *H01L 23/5223* (2013.01); *H01L 21/76898* (2013.01); *H01L 27/0251* (2013.01)

(58) Field of Classification Search
None
See application file for complete search history.

(56) References Cited

U.S. PATENT DOCUMENTS

| 6,621,680 | B1* | 9/2003 | Segervall | H01L 27/0285 |
| | | | | 361/111 |
| 7,280,329 | B2* | 10/2007 | Kim | H01L 27/0251 |
| | | | | 361/56 |
| 8,045,305 | B2* | 10/2011 | Nakahara | H01L 27/0266 |
| | | | | 361/56 |
| 2002/0149059 | A1* | 10/2002 | Ker | H01L 27/0277 |
| | | | | 257/355 |
| 2002/0153571 | A1* | 10/2002 | Mergens | H01L 27/0262 |
| | | | | 257/358 |
| 2005/0045955 | A1* | 3/2005 | Kim | H01L 27/0251 |
| | | | | 257/355 |
| 2005/0108670 | A1* | 5/2005 | Voidman | G06F 30/39 |
| | | | | 716/112 |
| 2006/0065931 | A1* | 3/2006 | Lee | H01L 27/0255 |
| | | | | 257/355 |
| 2008/0151446 | A1* | 6/2008 | Ker | H01L 27/027 |
| | | | | 361/56 |
| 2014/0191368 | A1* | 7/2014 | Usami | H01L 29/87 |
| | | | | 257/546 |
| 2014/0286085 | A1* | 9/2014 | Miyakawa | G11C 5/147 |
| | | | | 365/158 |
| 2016/0241024 | A1* | 8/2016 | Dupuis | H01L 24/85 |

* cited by examiner

*Primary Examiner* — Nishath Yasmeen
(74) *Attorney, Agent, or Firm* — Perkins Coie LLP

(57) ABSTRACT

Semiconductor devices having busing layouts configured to reduce on-die capacitance are disclosed herein. In one embodiment, a semiconductor device includes an electrostatic discharge device electrically connected in parallel with an integrated circuit and configured to divert high voltages generated during an electrostatic discharge event away from the integrated circuit. The semiconductor device further includes a signal bus and a power bus electrically connected to the electrostatic discharge device. The signal bus includes a plurality of first fingers grouped into first groups and the power bus includes a plurality of second fingers grouped into second groups. The first groups are positioned generally parallel to and interleaved between the second groups.

22 Claims, 4 Drawing Sheets

SEMICONDUCTOR DEVICES HAVING ELECTROSTATIC DISCHARGE LAYOUTS FOR REDUCED CAPACITANCE

TECHNICAL FIELD

The present technology generally relates to semiconductor devices, and more particularly relates to semiconductor devices having busing layouts configured to reduce on-die capacitance.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others.

Improving memory devices, generally, may include increasing memory cell density, increasing read/write speeds or otherwise reducing operational latency, increasing reliability, increasing data retention, reducing power consumption, or reducing manufacturing costs, among other metrics. One such other metric is reducing the size or footprint of the memory devices and/or components of the memory devices. Manufacturers achieve size reduction through scaling, various architectural decisions, and/or logic optimizations. One difficulty with reducing the size of a memory device is that a size reduction often results in increased parasitic capacitance (e.g., fringing capacitance) within the memory device as conductive structures carrying different voltages are positioned nearer to one another. Such capacitance can diminish the speed and performance of the memory device.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
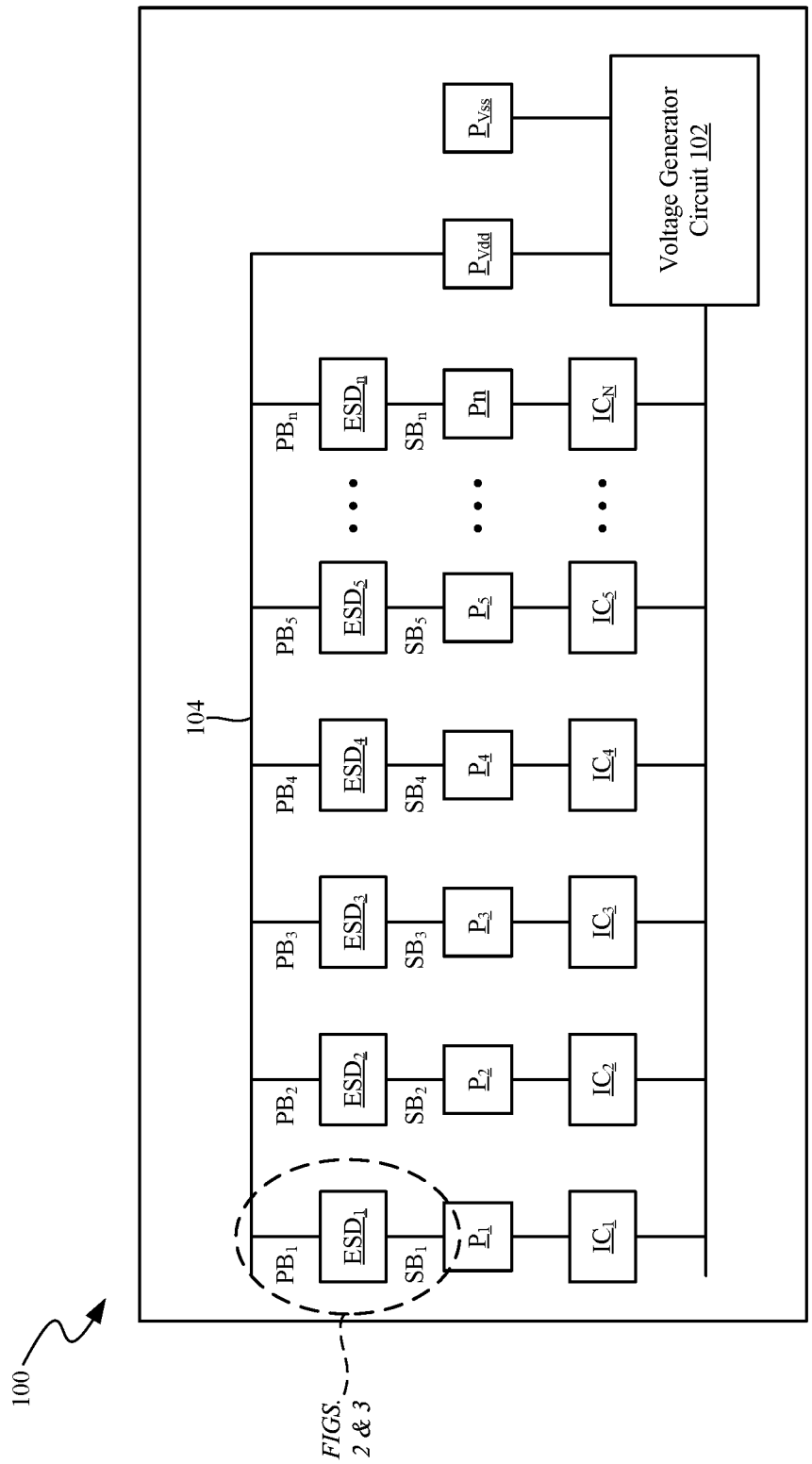
FIG. 1 is a block diagram illustrating a semiconductor device configured in accordance with an embodiment of the present technology.

Specific details of several embodiments of semiconductor devices are described below along with related systems and methods. Examples of semiconductor devices include logic devices, memory devices, and microprocessors, among others. The term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-4.

Semiconductor devices, such as memory devices, often include integrated circuitry that is configured to tolerate a tightly controlled range of operating voltages. Therefore, an electrostatic discharge event can often damage the sensitive integrated circuitry of a semiconductor device, even rendering the semiconductor device inoperable. Accordingly, many semiconductor devices include electrostatic discharge protection devices ("electrostatic discharge devices") that are configured to reduce the effects of electrostatic discharge events. However, because electrostatic discharge events can produce voltages that are far greater (e.g., hundreds or thousands of times greater) than normal operating voltages, a relatively large amount of metal bussing (e.g., tracing, wiring, etc.) is often required to connect the electrostatic discharge protection devices. As described in greater detail below, this metallization can significantly increase the capacitance within a semiconductor device—thereby diminishing the operating speed and/or other aspects of the performance of the semiconductor device.

In several of the embodiments described below, a semiconductor device includes an electrostatic discharge device that protects integrated circuitry of the semiconductor device from electrostatic discharge events. The semiconductor device also includes a metallization structure that electrically couples the electrostatic discharge device to a signal pad (or pin) and a power pad (or pin) of the semiconductor device. More particularly, the metallization structure includes a plurality of elongate first metal traces electrically coupling the signal pad to the electrostatic discharge device, and a plurality of elongate second metal traces electrically coupling the electrostatic discharge device to the power pad. The first metal traces are grouped into a plurality of first groups, the second metal traces are grouped into a plurality of second groups, and the first and second groups are generally arranged parallel to and interleaved between one another. By interleaving groups of the first and second metal traces—as opposed to interleaving each of the individual first and second metal traces—the separation between the first and second metal traces is increased. This greater separation of metal traces carrying dissimilar voltages reduces the parasitic on-die capacitance within the semiconductor device.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/ below, up/down, and left/right can be interchanged depending on the orientation.

FIG. 1 is a block diagram schematically illustrating a semiconductor device (e.g., a memory device) 100 configured in accordance with an embodiment of the present technology. In general, the semiconductor device 100 includes integrated circuits or components, data storage elements, processing components, and/or other features manufactured on a semiconductor substrate. In the illustrated embodiment, for example, the semiconductor device 100 includes a plurality of integrated circuits $IC_1$-$IC_n$. The integrated circuits $IC_1$-$IC_n$ can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features.

The semiconductor device 100 further includes conductive pads (or pins) $P_1$-$P_n$ electrically coupled to corresponding ones of the integrated circuits $IC_1$-$IC_N$. In some embodiments, the pads $P_1$-$P_n$ are in/out (I/O) signal pads (e.g., DQ, DQS, DBI, and/or DMI data terminals) that are formed of an electrically conductive material and accessible at a surface of the semiconductor device 100 for receiving/outputting data, as is well known in the art. The semiconductor device 100 also includes power supply pads (or pins) $P_{Vdd}$ and $P_{Vss}$ that are accessible at the surface of the semiconductor device 100 for electrical connection to a power supply. In some embodiments, the semiconductor device 100 can include a voltage generator circuit 102 configured to generate various internal potentials that can be supplied to the integrated circuits $IC_1$-$IC_N$.

In the illustrated embodiment, the semiconductor device 100 includes protection circuits or electrostatic discharge devices $ESD_1$-$ESD_n$ that are electrically coupled to (i) corresponding ones of the pads $P_1$-$P_n$ via signal buses $SB_1$-$SB_n$, and (ii) the power supply pad $P_{Vdd}$ and/or a common power supply rail 104 via power buses $PB_1$-$PB_n$. Accordingly, the electrostatic discharge devices $ESD_1$-$ESD_n$ are each electrically connected in parallel with a corresponding one of the integrated circuits $IC_1$-$IC_n$. In some embodiments, some or all of the electrostatic discharge devices $ESD_1$-$ESD_n$ can be electrically coupled instead to the power supply pad $P_{Vss}$, or a different source that supplies a power supply potential. In some embodiments, the electrostatic discharge devices $ESD_1$-$ESD_n$ can be formed in and/or on the semiconductor substrate of the semiconductor device 100 and can each include one or more diodes (e.g., multiple diodes electrically connected in parallel). In some embodiments, the one or more diodes each include multiple source/drain (S/D) connections to the power supply and to the corresponding pads $P_1$-$P_n$. In other embodiments, the electrostatic discharge devices $ESD_1$-$ESD_n$ can be other types of suitable circuits formed in and/or on the semiconductor substrate of the semiconductor device 100.

The electrostatic discharge devices $ESD_1$-$ESD_n$ are configured to protect the integrated circuits $IC_1$-$IC_n$ from damage during an electrostatic discharge event by discharging or diverting the voltage from an electrostatic discharge event to the power supply (e.g., to the power supply pad $P_{Vdd}$). That is, the electrostatic discharge devices $ESD_1$-$ESD_n$ inhibit or prevent the significant (e.g., excess) current from an electrostatic discharge event from being routed through the integrated circuits $IC_1$-$IC_n$, which can have operating voltages/currents far below those generated by the electrostatic discharge event. For example, the normal operating potentials supplied to the pads $P_1$-$P_n$ can be about 1.2 V, and the normal operating currents can be on the order of microamperes. However, an electrostatic discharge event can generate voltages of up to 2000 V or greater and currents of up to 2 A or greater. In some embodiments, industry standards require that each of the electrostatic discharge devices $ESD_1$-$ESD_n$ be able to withstand an electrostatic discharge event that generates voltages of a certain magnitude.

In general, the signal buses $SB_1$-$SB_n$ and the power buses $PB_1$-$PB_n$ (collectively "buses PB and SB") can comprise a portion of a metallization structure that is formed on the semiconductor substrate of the semiconductor device 100. Because the electrostatic discharge devices $ESD_1$-$ESD_n$ are designed to withstand large voltages/currents that can be significantly greater than the normal operating voltages of the semiconductor device 100, the buses PB and SB can be formed with sufficient metallization to withstand the same large voltages/currents. That is, the buses PB and SB are designed to withstand a certain amount of current density without fusing open or otherwise becoming damaged as a result of, for example, electro-migration effects. Often, however, manufacturing constraints limit the maximum dimensions of the buses PB and SB to a size that is too small to withstand the high current densities caused by an electrostatic discharge event. Accordingly, the signal buses PB and SB can include a plurality of metal lines (e.g., traces, wires, etc.) that are electrically coupled in parallel and that collectively provide sufficient metallization to withstand the required voltages/currents produced by an electrostatic discharge event.

Figure 2:
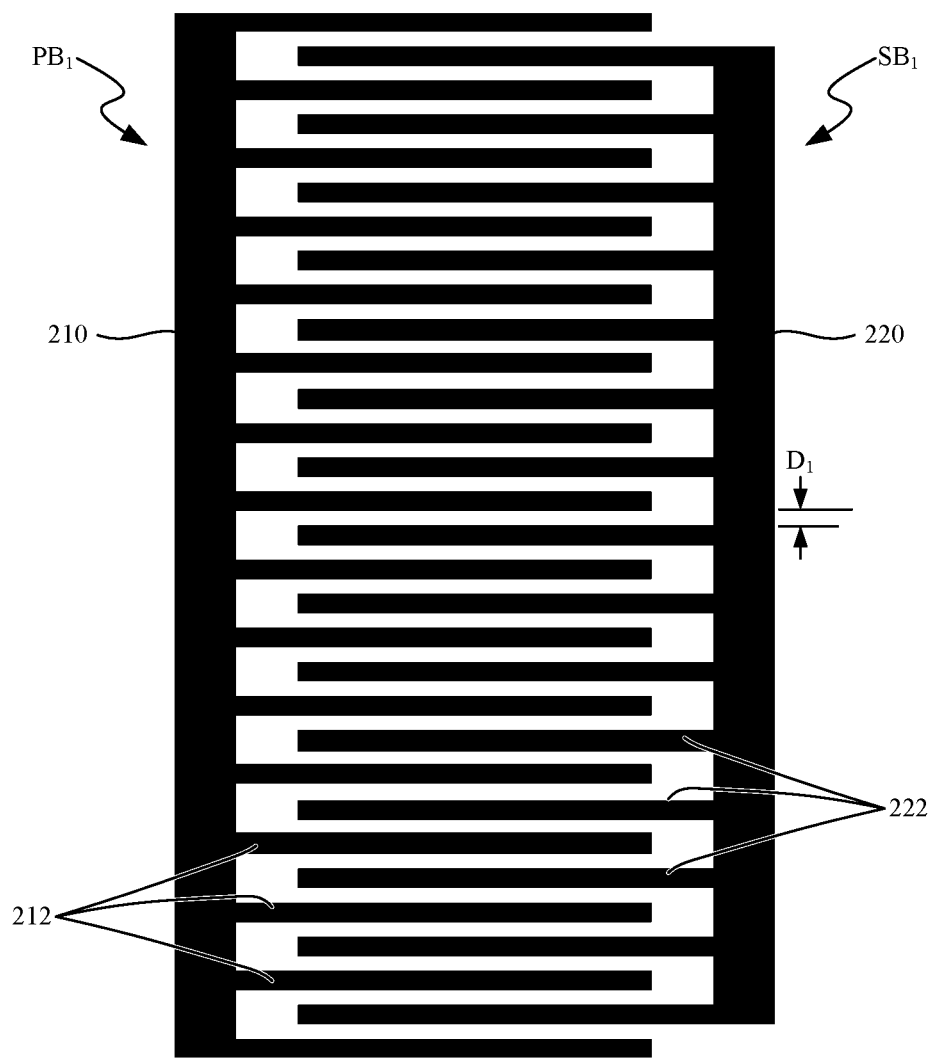
FIG. 2 is a schematic top view of a portion of a metallization structure configured in accordance with the prior art.

For example, FIG. 2 is a schematic top view of the metallization structure of the semiconductor device 100 showing the signal bus $SB_1$ and the power bus $PB_1$ configured in accordance with the prior art. As shown, the power bus $PB_1$ comprises an elongate first cross member 210 and a plurality of elongate first fingers 212 extending generally perpendicular to the first cross member 210 and generally parallel to one another (e.g., forming a comb-like pattern). The signal bus $SB_1$ similarly comprises an elongate second cross member 220 and a plurality of elongate second fingers 222 extending generally perpendicular to the second cross member 220 and generally parallel to one another. As shown, the second fingers 222 are interleaved or interdigitated between the first fingers 212 such that the first and second fingers 212, 222 (collectively "fingers 212, 222") form an alternating pattern or layout. Accordingly, each first finger 212 is positioned directly adjacent to (e.g., neighboring) one or two of the second fingers 222, and is not positioned directly adjacent to another first finger 212 (and visa versa). A distance $D_1$ between adjacent pairs of the fingers 212, 222 is generally the same between each adjacent pair. The distance $D_1$ can be about twice the minimum separation permitted by the manufacturing process used to create the metallization structure including the signal bus $SB_1$ and the power bus $PB_1$. For example, the distance $D_1$ can be about 0.5 µm.

In general, the metallization structure of the semiconductor device 100 can include multiple metal layers that add to the capacitance of the pad $P_1$. For example, overlapping portions of different metal layers (e.g., different metal layers positioned vertically on top of one another) and/or planar metal arrangements within each layer can add to the capacitance. More particularly, the alternating interleaved layout of the fingers 212, 222 contributes to the capacitance on the pad $P_1$ because the fingers 212, 222 carry different voltages—resulting in fringing capacitance. That is, the electric current carried by the fingers 212, 222 generates electric fields that extend in three dimensions and that add to the total capacitance of the pad $P_1$. Moreover, the fingers 212, 222 are arranged over interconnects (e.g., through silicon vias) that extend vertically between the fingers 212, 222 and the electrostatic discharge device $ESD_1$ that is formed in and/or on the semiconductor substrate of the semiconductor device 100. The conventional layout of the fingers 212, 222 illustrated in FIG. 2 requires that the interconnects have a similar (e.g., alternating) layout, which further adds to the capacitance of the pad $P_1$ as a result of fringing capacitance (e.g., sidewall capacitance) between the closely arranged interconnects carrying different voltages. The added capacitance from the interconnects can be as much as that added from overlapping metal layers or the planar arrangement of each layer.

Figure 3:
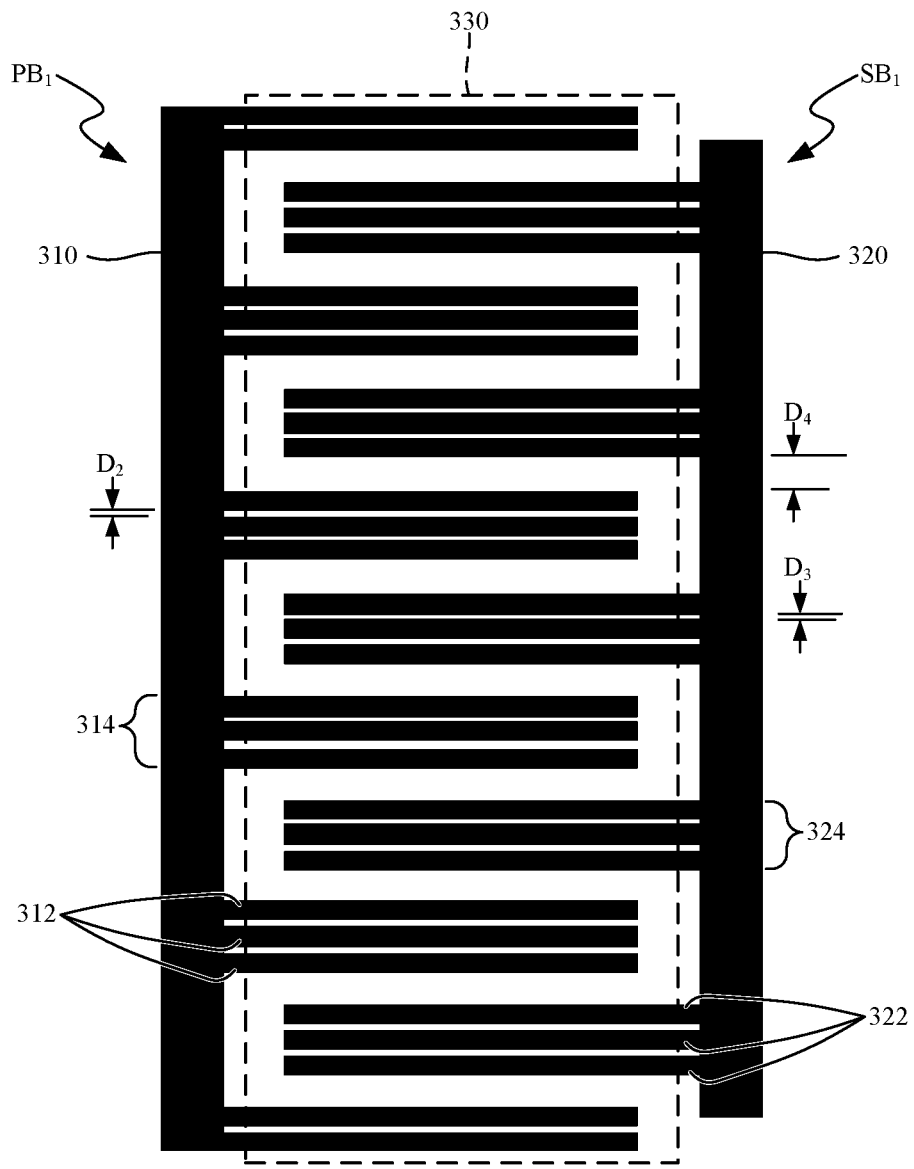
FIG. 3 is a schematic top view of a portion of a metallization structure configured in accordance with an embodiment of the present technology.

FIG. 3, in contrast, is a schematic top view of the metallization structure of the semiconductor device 100 showing the power bus $PB_1$ and the signal bus $SB_1$ configured in accordance with an embodiment of the present technology. In general, the power bus $PB_1$ and the signal bus $SB_1$ have the same total amount of metallization as shown in FIG. 2 (e.g., an amount sufficient to withstand an electrostatic discharge event), but are arranged in a novel manner that reduces the capacitance on the pad $P_1$. In particular, the power bus $PB_1$ comprises an elongate first cross member 310 and a plurality of elongate first fingers (e.g., metal traces) 312 extending generally perpendicular to the first cross member 310 and generally parallel to one another. The signal bus $SB_1$ similarly comprises an elongate second cross member 320 and a plurality of elongate second fingers 322 extending generally perpendicular to the second cross member 320 and generally parallel to one another. The first and second cross members 310, 320 (collectively "cross members 310, 320") and/or the first and second fingers 312, 322 (collectively "fingers 312, 322") can be formed from copper (Cu), aluminum (Al), silver (Ag), gold (Au), platinum (Pt), and/or other suitable electrically conductive materials. In the illustrated embodiment, the power bus $PB_1$ includes sixteen first fingers 312 and the signal bus $SB_1$ includes fifteen second fingers 322. In other embodiments, however, the power bus $PB_1$ and/or the signal bus $SB_1$ can have a different number of fingers 312, 322, respectively, and/or the fingers 312, 322 can be arranged differently (e.g., angled relative to the cross members 310, 320, having varying lengths, non-parallel relative to one another, etc.).

In the illustrated embodiment, the first fingers 312 are arranged (e.g., positioned, grouped, etc.) in a plurality of first groups 314 and the second fingers 322 are arranged in a plurality of second groups 324. More particularly, the first groups 314 each include two or more of the first fingers 312 that are separated by (e.g., spaced apart by) a distance $D_2$, and the second groups 324 each include two or more of the second fingers 322 that are separated by a distance $D_3$. Accordingly, each first finger 312 is positioned directly adjacent to at least one other first finger 312, and each second finger 322 is positioned directly adjacent to at least one other second finger 322. In some embodiments, the distances $D_2$ and $D_3$ can be the same. For example, the distances $D_2$ and $D_3$ can be the minimum separation permitted by the manufacturing process used to create the metallization structure including the power bus $PB_1$ and the signal bus $SB_1$. Notably, closely spacing the first fingers 312 in the first groups 314 and the second fingers 322 in the second groups 324 (e.g., minimizing the distances $D_2$ and $D_3$) does not increase the capacitance on the pad $P_1$ because each of the first fingers 312 carries the same voltage and each of the second fingers 322 carries the same voltage. Put differently, there is no voltage difference between the fingers in the groups 314, 324 that could generate fringing capacitance.

The second groups 324 are interleaved or interdigitated between the first groups 314 such that the first and second groups 314, 324 (collectively "groups 314, 324") form an alternating pattern or layout. Each first group 314 is separated from (e.g., spaced apart from) a directly adjacent one of the second groups 324 by a distance $D_4$. In the illustrated embodiment, the distance $D_4$ between each pair of directly adjacent groups 314, 324 is the same while, in other embodiments, the distance D4 can differ such that one or more of the pairs of directly adjacent groups 314, 324 are spaced more closely together than another pair. Notably, the distance $D_4$ is greater than the distances $D_1$ (FIG. 2), $D_2$, and $D_3$. In some embodiments, for example, the distance $D_4$ can be about six times greater than the distances D2 and D3. For example, the distances $D_2$ and $D_3$ can be between about 0.15-0.25 μm (e.g., about 0.22 μm) and the distance $D_4$ can be between about 1.25-1.35 μm (e.g., about 1.30 μm). Accordingly, the busing layout of the semiconductor device 100 illustrated in FIG. 3 reduces the total amount of parasitic fringing capacitance on the pad $P_1$ by increasing the separation (e.g., $D_4$) between the first fingers 312 and the second fingers 322, which each carry different voltages. That is, arranging the fingers 312, 322 together in groups 314, 324 with relatively small (e.g., minimum) separation between them advantageously permits the separation between the first fingers 312 and the second fingers 322 to be increased while maintaining the same total amount of metallization (e.g., the same number of fingers) as conventional semiconductor devices (FIG. 2).

The fingers 312, 322 are at least partially arranged over interconnects (e.g., through silicon vias) that extend vertically between the fingers 312, 322 and the electrostatic discharge device $ESD_1$ that is formed in and/or on the semiconductor substrate of the semiconductor device 100. For example, in some embodiments, the power bus $PB_1$ and the signal bus $SB_1$ can be formed over the semiconductor substrate of the semiconductor device 100 such that the fingers 312, 322 are at least partially coplanar and/or aligned over a footprint 330 of the electrostatic discharge device $ESD_1$. In some embodiments, the grouped layout of the fingers 312, 322 illustrated in FIG. 3 requires that the interconnects aligned under the fingers 312, 322 have a similar (e.g., grouped alternating) structure with increased spacing being interconnects carrying different voltages. This arrangement further decreases the total capacitance on the pad $P_1$ by reducing the fringing capacitance (e.g., sidewall capacitance) between the interconnects. That is, the three-dimensional arrangement of the fingers 312, 322 and the corresponding, vertically extending interconnects can advantageously reduce the total capacitance on the pad $P_1$.

In the illustrated embodiment, the groups 314, 324 are generally evenly spaced along the lengths of the cross member 310, 320, respectively, such that the power bus $PB_1$ and the signal bus $SB_1$ each have a generally symmetrical shape. In some embodiments, the groups 314, 324 are also generally evenly spaced along a dimension of the footprint 330 of the electrostatic discharge device $ESD_1$. This arrangement can facilitate a generally uniform current distribution across the electrostatic discharge device $ESD_1$—which may require uniform current distribution and/or have an improved performance or lifetime as a result of uniform current distribution. In other embodiments, however, the groups 314, 324 may not be uniformly spaced and the power bus $PB_1$ and the signal bus $SB_1$ can be asymmetrical. In a particular example, the power bus $PB_1$ could include a single first group 314 of first fingers 312 (e.g., having sixteen first fingers 312) and the signal bus $SB_1$ could include a single second group 324 of second fingers 322 (e.g., having fifteen second fingers 322). It is expected that such an arrangement or layout would have reduced fringing capacitance compared to the embodiment shown in FIG. 3—as a result of increased separation between the fingers 312, 322—but would provide an imbalanced current distribution to the electrostatic discharge device $ESD_1$.

Although only the power bus $PB_1$ and the signal bus $SB_1$ are illustrated in FIG. 3, the buses PB and SB connected to each of the electrostatic discharge devices $ESD_1$-$ESD_n$ can have the same or a similar configuration to advantageously reduce the capacitance on each of the signal pads $P_1$-$P_n$. The buses PB and SB can be formed as part of a suitable metallization process and arranged in one or more layers that are formed on the semiconductor substrate of the semiconductor device 100. Notably, the buses SB and PB having layouts configured in accordance with embodiments of the present technology can be formed without adding significant additional costs or complexity to existing manufacturing methods (e.g., by simply changing one or more mask patterns used to form the metallization structure).

As set forth above, the present technology reduces the capacitance on signal lines (I/O lines) of a semiconductor device, such as a memory device. For example, in some embodiments the overall capacitance reduction for a particular pin or pad can be 30% or more (e.g., from about 260 pF to 170 pF or less). This reduced capacitance advantageously permits the semiconductor device to operate, for example, at greater speeds—especially during high frequency operations.

Figure 4:
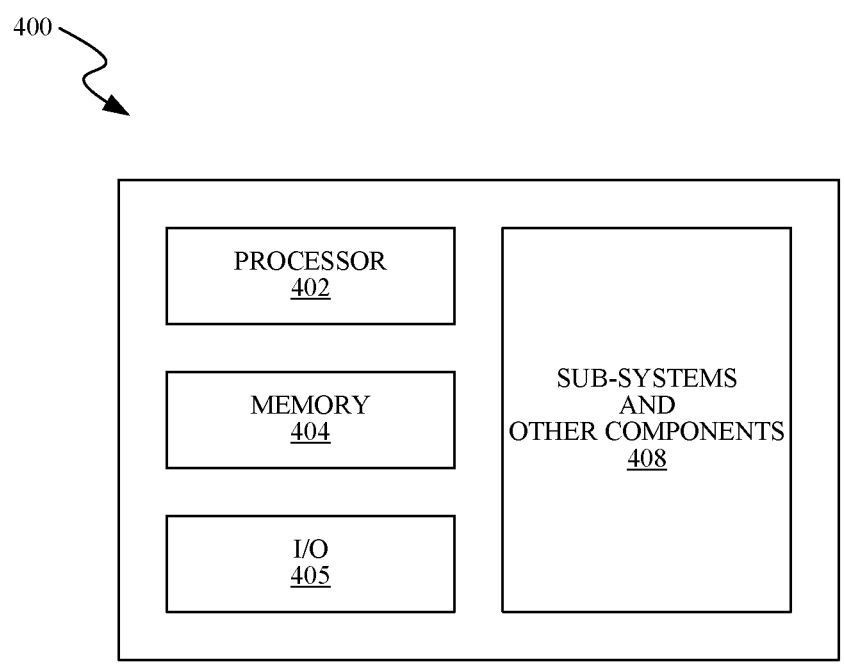
FIG. 4 is a block diagram illustrating a system that includes a semiconductor device configured in accordance with embodiments of the present technology.

Any one of the semiconductor devices having the features described above with reference to FIGS. 1 and 3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 405, and/or other subsystems or components 408. The semiconductor devices described above with reference to FIGS. 1 and 3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
a semiconductor substrate having an integrated circuit;
a conductive pad electrically coupled to the integrated circuit;
an electrostatic discharge device electrically coupled to the conductive pad; and
a metallization structure on the semiconductor substrate, the metallization structure including—
a signal bus electrically coupling the electrostatic discharge device to the conductive pad, wherein the signal bus includes a plurality of first fingers arranged in two or more first groups; and
a power bus electrically coupled to the electrostatic discharge device and configured to provide a power supply potential to the electrostatic discharge device, wherein the power bus includes a plurality of second fingers arranged in two or more second groups,
wherein the first fingers are positioned parallel to the second fingers,
wherein each first finger is immediately adjacent to at least one other first finger,
wherein each second finger is immediately adjacent to at least one other second finger,
wherein the first groups are interleaved between the second groups to form an alternating pattern such that each of the first groups is immediately adjacent a corresponding one or more of the second groups, and
wherein a spacing between a first group and an immediately adjacent second group is greater than (a) a spacing between immediately adjacent ones of the first fingers in the first group and (b) a spacing between immediately adjacent ones of the second fingers in the second group.

2. The semiconductor device of claim 1 wherein—
the signal bus includes an elongate first cross member connecting the first fingers and extending perpendicular to the first fingers,
the first groups are evenly spaced along the length of the first cross member,
the power bus includes an elongate second cross member connecting the second fingers and extending perpendicular to the second fingers, and
the second groups are evenly spaced along the length of the second cross member.

3. The semiconductor device of claim 1 wherein the plurality of first fingers includes at least fifteen first fingers, and wherein the plurality of second fingers includes at least fifteen second fingers.

4. The semiconductor device of claim 1 wherein the electrostatic discharge device is formed in the semiconductor substrate, and further comprising a plurality of interconnects extending between the first and second fingers and the electrostatic discharge device.

5. The semiconductor device of claim 1 wherein the electrostatic discharge device is electrically connected in parallel with the integrated circuit.

6. The semiconductor device of claim 1 wherein the electrostatic discharge device includes a plurality of diodes electrically connected in parallel.

7. The semiconductor device of claim 1 wherein the conductive pad is a first conductive pad, wherein the power supply potential is a ground potential, and further comprising a second conductive pad electrically coupled to the ground potential.

8. The semiconductor device of claim 1 wherein the first and second fingers are coplanar.

9. The semiconductor device of claim 1 wherein the semiconductor device comprises a dynamic random access memory (DRAM) device.

10. The semiconductor device of claim 9 wherein the semiconductor device comprises a DRAM module including the DRAM device.

11. A memory device, comprising:
a semiconductor substrate having memory circuits and protection circuits;
conductive pads electrically coupled to the memory circuits and to the protection circuits; and
a metallization structure connecting the protection circuits to corresponding ones of the conductive pads and to a power supply, wherein the metallization structure includes, for each protection circuit and the corresponding conductive pad—
first metal traces electrically coupling the protection circuit to the conductive pad, wherein the first metal traces are positioned in first groups;
second metal traces electrically coupling the protection circuit to the power supply, wherein the second metal traces are positioned in second groups,
wherein the first groups are positioned parallel to the second groups,
wherein the first groups are interleaved between the second groups to form an alternating pattern such that each of the first groups is immediately adjacent a corresponding one or more of the second groups, and
wherein a distance between a first group and an immediately adjacent second group is greater than (a) a first distance between immediately adjacent ones of the first metal traces of the first group and (b) a second distance between immediately adjacent ones of the second metal traces of the second group.

12. The memory device of claim 11 wherein the first distance is the same as the second distance.

13. The memory device of claim 11 wherein, during an electrostatic discharge event, the protection circuits are configured to divert excess voltage to the power supply such that the excess voltage does not pass through the memory circuits.

14. The memory device of claim 11 wherein individual ones of the protection circuits include at least one diode.

15. The memory device of claim 11 wherein the first groups are interleaved between the second groups to form the alternating pattern such that each of the first groups is immediately adjacent the corresponding one or more of the second groups without an intervening first group.

16. The memory device of claim 11 wherein:
each of the first metal traces is positioned immediately adjacent at least one other first metal trace without an intervening second metal trace; or
each of the second metal traces is positioned immediately adjacent at least one other second metal trace without an intervening first metal trace.

17. The semiconductor device of claim 1 wherein the electrostatic discharge device includes at least one diode.

18. The semiconductor device of claim 1 wherein each first finger is immediately adjacent to the at least one other first finger without an intervening second finger.

19. The semiconductor device of claim 1 wherein each second finger is immediately adjacent to the at least one other second finger without an intervening first finger.

20. The semiconductor device of claim 1 wherein the spacing between the immediately adjacent ones of the first fingers in the first group is equivalent to the spacing between the immediately adjacent ones of the second fingers in the second group.

21. The semiconductor device of claim 1 wherein the power supply potential is a positive power supply potential $V_{DD}$.

22. The semiconductor device of claim 1 wherein the first groups are interleaved between the second groups to form the alternating pattern such that each of the first groups is immediately adjacent the corresponding one or more of the second groups without an intervening first group.

* * * * *